US011121263B2

(12) United States Patent
Lee et al.

(10) Patent No.: US 11,121,263 B2
(45) Date of Patent: Sep. 14, 2021

(54) HYDROGEN TRAP LAYER FOR DISPLAY DEVICE AND THE SAME

(71) Applicant: Apple Inc., Cupertino, CA (US)

(72) Inventors: Jehun Lee, Seoul (KR); Ching-Sang Chuang, Sunnyvale, CA (US); Hirokazu Yamagata, Yokohama (JP); Jiun-Jye Chang, Hsinchu (TW); Kenny Kim, San Jose, CA (US); Po-Chun Yeh, Cupertino, CA (US); Shih Chang Chang, Cupertino, CA (US); Ting-Kuo Chang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/746,527

(22) Filed: Jan. 17, 2020

(65) Prior Publication Data

US 2021/0066505 A1 Mar. 4, 2021

Related U.S. Application Data

(60) Provisional application No. 62/892,299, filed on Aug. 27, 2019.

(51) Int. Cl.
*H01L 29/786* (2006.01)
*H01L 27/12* (2006.01)

(52) U.S. Cl.
CPC .... *H01L 29/78696* (2013.01); *H01L 27/1248* (2013.01); *H01L 27/1251* (2013.01); *H01L 29/7869* (2013.01); *H01L 29/78651* (2013.01)

(58) Field of Classification Search
CPC ............. H01L 27/1248; H01L 27/1251; H01L 27/1225; H01L 27/105; H01L 29/78696; H01L 29/78651; H01L 29/7869
See application file for complete search history.

(56) References Cited

U.S. PATENT DOCUMENTS

| 4,110,425 | A | 8/1978 | Buhl et al. | |
|---|---|---|---|---|
| 8,502,217 | B2 | 8/2013 | Sato et al. | |
| 8,710,762 | B2* | 4/2014 | Takahashi | H02M 3/156 |
| | | | | 315/291 |
| 8,981,359 | B2 | 3/2015 | Kum et al. | |
| 9,159,747 | B2* | 10/2015 | Nakano | H01L 29/7869 |
| 9,246,007 | B2 | 1/2016 | Cheng et al. | |
| 9,318,612 | B2 | 4/2016 | Seo et al. | |
| 9,960,278 | B2 | 5/2018 | Sato et al. | |
| 10,388,798 | B2* | 8/2019 | Takechi | H01L 29/66969 |
| 2011/0304311 | A1* | 12/2011 | Takahashi | H02M 3/155 |
| | | | | 323/311 |
| 2014/0117359 | A1 | 5/2014 | Yuan et al. | |
| 2014/0284594 | A1* | 9/2014 | Nakano | H01L 29/7869 |
| | | | | 257/43 |
| 2014/0312341 | A1 | 10/2014 | Chiang et al. | |

(Continued)

OTHER PUBLICATIONS

International Patent Application No. PCT/US2020/046488, "Invitation to Pay Additional Fees" dated Oct. 22, 2020, 10 pages.

*Primary Examiner* — Nikolay K Yushin
(74) *Attorney, Agent, or Firm* — Aikin & Gallant, LLP

(57) ABSTRACT

Display panels with hydrogen trap layers are described. The hydrogen trap layers may be incorporated into a variety of locations to getter or block hydrogen diffusion into the semiconductor oxide layer of an oxide transistor.

21 Claims, 13 Drawing Sheets

(56) References Cited

U.S. PATENT DOCUMENTS

| | | |
|---|---|---|
| 2016/0079437 A1 | 3/2016 | Ochi et al. |
| 2017/0117304 A1 | 4/2017 | Kim et al. |
| 2017/0309752 A1 | 10/2017 | Yamazaki et al. |
| 2017/0317111 A1 | 11/2017 | Ando et al. |
| 2017/0317217 A1 | 11/2017 | Ito et al. |
| 2018/0166585 A1* | 6/2018 | Takechi ................. H01L 27/12 |
| 2018/0286888 A1 | 10/2018 | Yamaguchi et al. |
| 2018/0286889 A1 | 10/2018 | Yamaguchi |
| 2019/0081088 A1 | 3/2019 | Cho et al. |

* cited by examiner

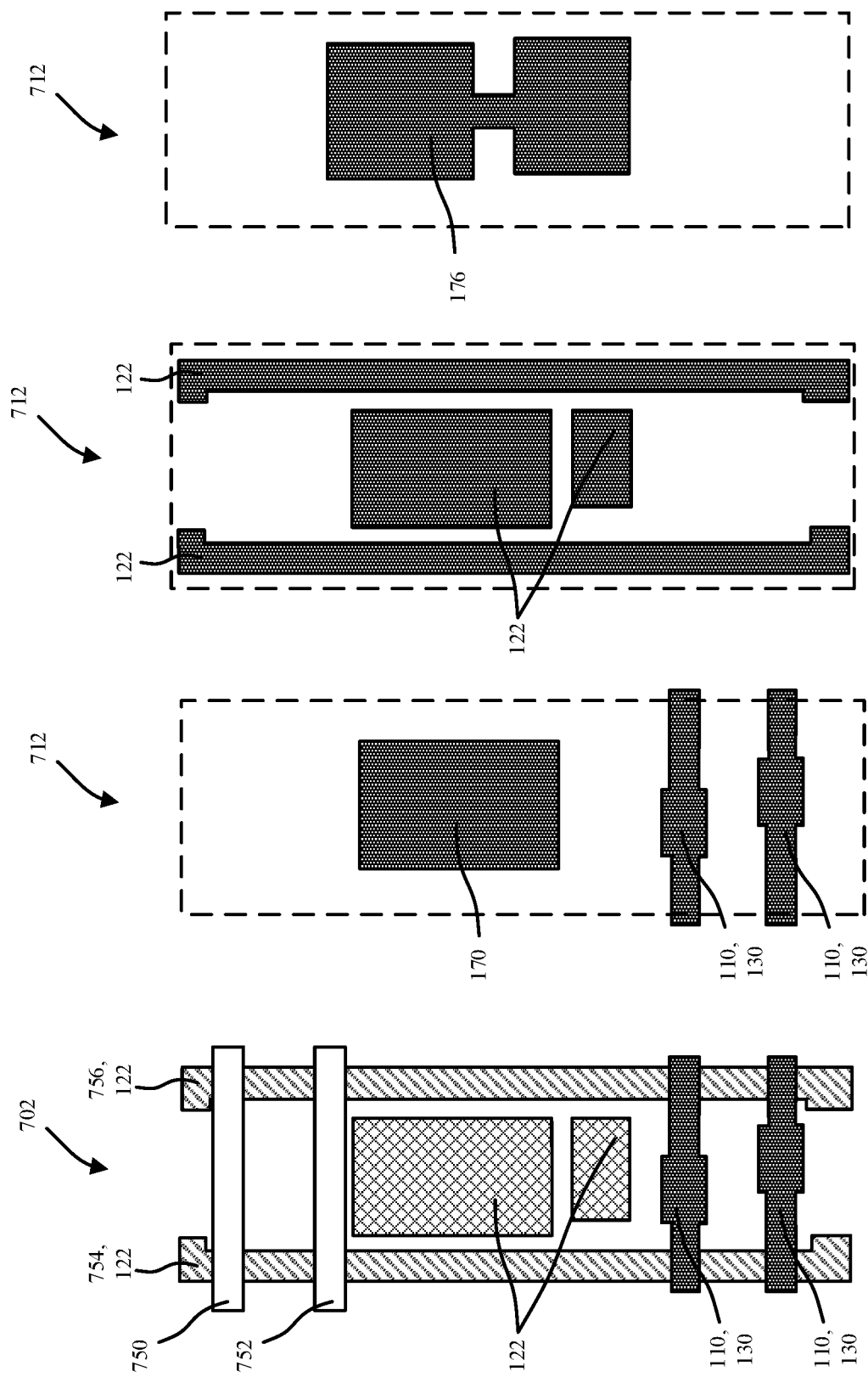

HYDROGEN TRAP LAYER FOR DISPLAY DEVICE AND THE SAME

RELATED APPLICATIONS

This application claims the benefit of priority from U.S. Provisional Patent Application Ser. No. 62/892,299 filed on Aug. 27, 2019, the full disclosure of which is incorporated herein by reference.

BACKGROUND

Field

Embodiments described herein relate display devices, and more particularly to the incorporation of hydrogen trap layers.

Background Information

Display panels such as liquid crystal display (LCD) and organic light emitting diode (OLED) display panels are commonly found in electronic devices such as cellular telephones, portable computers, televisions, wearable devices, etc. Both LCD and OLED technologies utilize thin film transistors (TFTs) in formation of the pixel circuitry or gate driver circuitry (e.g. gate in panel) found within the display panel.

Traditional TFT technology includes amorphous silicon (a-Si) TFTs and low temperature poly silicon (LTPS) TFTs. LTPS provides for greater charge carrier mobility compared to a-Si, which can be useful for scaling to high resolution displays. The LTPS process, however, may include a greater number of masks steps than the a-Si process.

Semiconductor oxide TFTs have been proposed as a new version of LTPS, with higher charge carrier mobilities than a-Si, and less mask steps than the LTPS process. LTPS TFTs may possess attributes such as high switching speed and drive current compared to semiconductor oxide TFTs, while semiconductor oxide TFTs may possess attributes such as low leakage current and better TFT uniformity compared to LTPS TFTs.

More recently, LTPS transistors have been combined with semiconductor oxide TFTs in a hybrid TFT arrangement termed low temperature polycrystalline silicon and oxide (LTPO). In such an arrangement the semiconductor oxide transistors can be any of the subpixel TFTs including switch TFT, driving TFT, buffer TFT, demultiplexer TFT, etc.

SUMMARY

Display structures and methods of formation including hydrogen trap layers are described. In an embodiment, a display panel includes a gate in panel (GIP) region adjacent an edge of the display panel, and a pixel area including an array of subpixels. Each subpixel includes an oxide transistor that includes a transistor hydrogen trap layer formed of a transistor material characterized by a negative entropy of solution of hydrogen. A dummy subpixel area is located between the GIP region and the pixel area, with the dummy subpixel area including a plurality of dummy subpixels. In an embodiment, each dummy subpixel includes a dummy hydrogen trap layer formed of a dummy material characterized by a negative entropy of solution of hydrogen. In such an embodiment, the dummy subpixels, or alternative structures, can be utilized to block/getter hydrogen diffusion from the edges of the display panel. Additional other structures can also be used to block/getter hydrogen diffusion, including intermediate routing layers, or top layers such as touch metal routing layers for touch cells.

In an embodiment, a display panel includes a pixel area including an array of subpixels, each subpixel including an oxide transistor gate layer that includes a gate hydrogen trap layer. In an embodiment a gate width of the gate layer is smallest for subpixels nearest a center of the pixel area, and the gate width of the gate layer is widest for subpixels nearest a periphery of the pixel area. In such an embodiment the gate width can be modulated to adjust the oxide transistor properties due to increased hydrogen diffusion from the edges of the display panel.

In an embodiment, a display panel includes a pixel area including an array of subpixels, with each subpixel including an oxide transistor that includes a bottom gate layer, an oxide buffer layer on the bottom gate layer, a semiconductor oxide layer on the oxide buffer layer, a gate dielectric layer on the semiconductor oxide layer, and a top gate layer on the gate dielectric layer. In an embodiment, the top gate layer has a wider gate width than the bottom gate layer. In such a configuration the top gate layer can function as a shield to hydrogen diffusion.

In an embodiment, a display panel includes a pixel area including an array of subpixels, with each subpixel including an oxide transistor that includes a bottom gate layer, an oxide buffer layer on the bottom gate layer, a semiconductor oxide layer on the oxide buffer layer, a gate dielectric layer on the semiconductor oxide layer, and a top gate layer on the gate dielectric layer. In an embodiment, the bottom gate layer has a wider gate width than the top gate layer. In such a configuration the bottom gate layer can function as a shield to hydrogen diffusion.

Various structures in accordance with embodiments may be incorporated into hybrid thin film transistor structures in order to protect the semiconductor oxide layer of an oxide transistor from hydrogen diffusion. Such structures may be repetitive across the pixels or subpixels of the display panel.

BRIEF DESCRIPTION OF THE DRAWINGS

FIG. 9D is a schematic top plan view of an active subpixel in accordance with an embodiment.

FIGS. 9E-9G are schematic top plan views of dummy subpixels in accordance with embodiments.

DETAILED DESCRIPTION

Figure 1A:
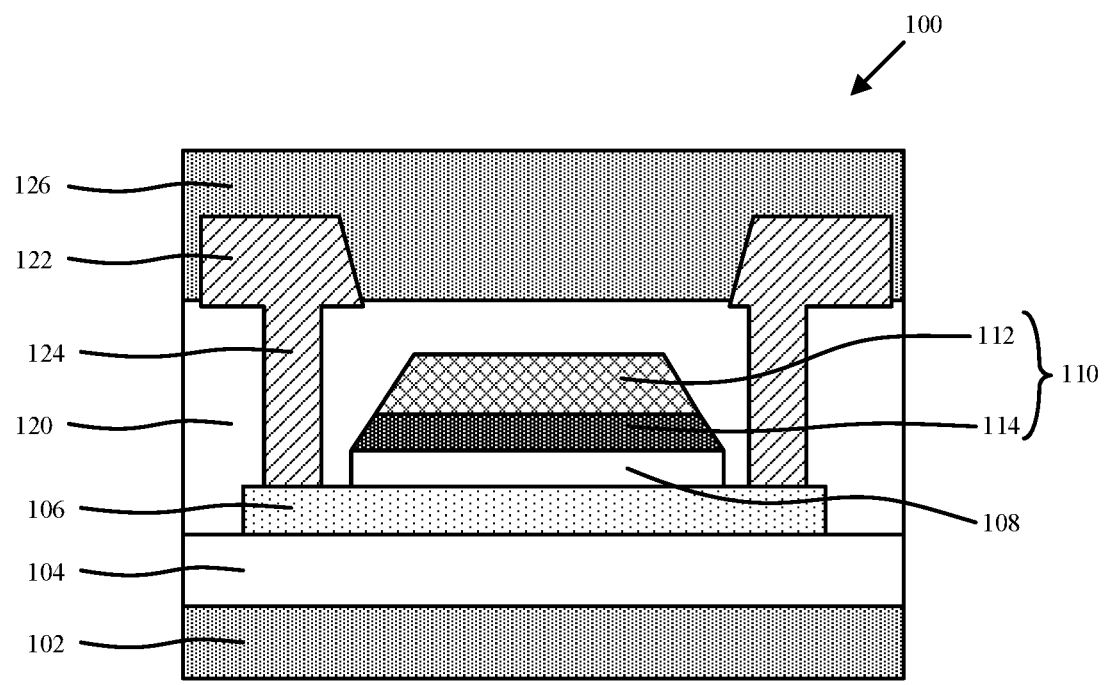
FIG. 1A is a schematic cross-sectional side view illustration of a top gate oxide transistor including a multiple layered gate layer with a hydrogen trap layer in accordance with an embodiment.

Embodiments describe display structures and methods of formation including hydrogen trap layers to protect the semiconductor oxide layer of an oxide transistor from hydrogen diffusion. It has been observed that conventional oxide thin film transistors (TFTs) degrade with reliability testing in LTPO display technology. In one aspect, LTPS may accommodate a hydrogen rich environment, while oxide transistors are sensitive to environmental hydrogen diffusion that cause their instability. It is believed that low temperature hydrogen diffusion from adjacent hydrogen containing layers (e.g. silicon nitride or silicon oxynitride encapsulation layers) may recombine with weakly bonded oxygen in a semiconductor oxide layer in an oxide TFT, resulting in vast threshold voltage (Vth) shift during the course of product lifetime, resulting in display malfunction, color shift, or luminance non-uniformity. In accordance with embodiments, a hydrogen trap layer is introduced at the subpixel or panel level to getter hydrogen in order to control and manage hydrogen diffusion amount. In this aspect, the hydrogen diffusion mechanism is governed by process integration design. In accordance with embodiment, the hydrogen trap layer(s) are introduced into the non-channel areas of the oxide transistors to tune the device characteristics.

In some embodiments, a gate layer stack-up includes hydrogen trapping metals (e.g. Li, Sc, Y, La, Ce, Ti, Zr, Hf, V, Nb, Ta) or their alloys to provide a shielding function from hydrogen diffusion into the semiconductor oxide channel of the oxide TFT. Additionally, the hydrogen trapping metals or their alloys can be included as part of the source, drain or other layer to provide the shielding function. The hydrogen trapping metals or their alloys may be separate hydrogen trap layer either on top or bottom of a metallic gate layer (or source/drain layer), or may be included in an alloyed gate layer (or source/drain layer), for example. Thus, the gate layer may be a single alloyed layer or a multi-layer stack. Additionally, multiple hydrogen trap layers may be included in the multi-layer stacks.

In some embodiments, the hydrogen trap layer is located in a bottom gate layer of a double gate oxide transistor, in which the bottom gate layer is wider than the top gate layer. In this manner the bottom gate layer can block hydrogen diffusion from an underlying layer into the channel of the double gate oxide transistor. Furthermore, such a self-aligned structure can result in the formation of a N+, N− junction in the semiconductor oxide layer. In such a configuration, the N− regions are within the shadow of the bottom gate layer, and the N+ regions are formed due to hydrogen diffusion. In this configuration, the N− regions can provide an ohmic contact with the semiconductor oxide (e.g. indium-gallium-zinc-oxide, IGZO) channel, which may reduce charge injection and transistor reliability.

In some embodiments, the hydrogen trap layer is located in a top gate layer of a double gate oxide transistor, in which the top gate layer is wider than the bottom gate layer. In this manner the top gate layer can block hydrogen diffusion from an overlying layer into the channel of the double gate oxide transistor. Furthermore, a step structure can be integrated into the transistor structure so that outside edges of the top gate layer step down from an interior portion of the top gate layer. Such a step structure may provide additional protection against lateral hydrogen diffusion into the semiconductor oxide layer channel region. The bottom gate layer may function as a dual purpose to provide a template for the step structure, in addition to functioning as the bottom gate layer.

In some embodiments, the oxide transistor gate width is modulated from center (shorter) to edge (wider) of a display panel. Thus, a wider gate width may correspond to larger hydrogen trap layer to protect against hydrogen diffusion. Depending upon configuration, gate width modulation can correspond to channel length modulation, though arrangements are possible where continued increase in gate width does not result in increased channel length for a double gate transistor structure. In a particular embodiment, gate width of the top gate layer is modulated. Alternatively, gate width of the bottom gate layer, or both, can be modulated.

In some embodiments, dummy hydrogen trap layers or subpixels are located in a peripheral area of the display panel, around the active subpixels. In an embodiment, a dummy subpixel area is located between a gate-in-panel (GIP) area and the pixel area. Such a dummy subpixel area may include non-functional pixels in which a dummy hydrogen trap layer can be incorporated into a variety of structures or layers. In this manner, the dummy pattern designs can be arranged around the entire active area (pixel area) and borders to macro-manage hydrogen diffusion amount to the active area of the display panel for front-of-screen uniformity and performance.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 1B:
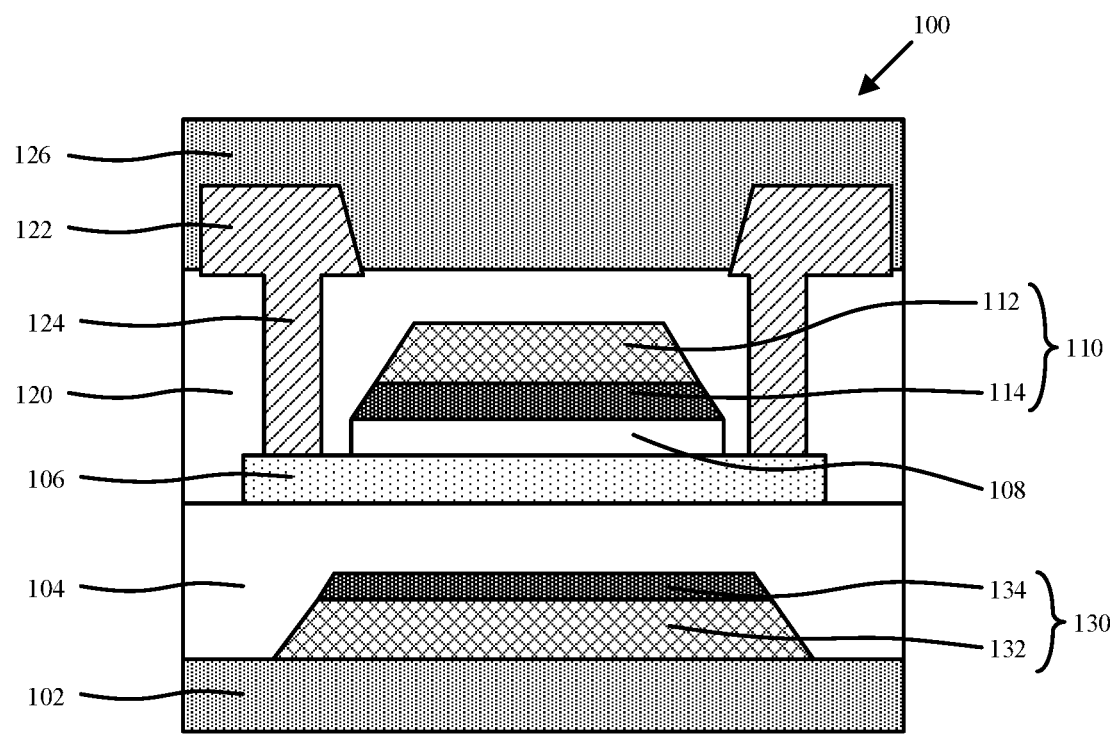
FIG. 1B is a schematic cross-sectional side view illustration of a double gate oxide transistor including a multiple layered gate layer with a hydrogen trap layer in accordance with an embodiment.

Referring now to FIG. 1A a cross-sectional side view illustration is provided of a top gate oxide transistor 100 including a lower gate hydrogen trap layer in accordance with an embodiment. FIG. 1B is a schematic cross-sectional side view illustration of a double gate oxide transistor 100 including a lower gate hydrogen trap layer in the top gate layer in accordance with an embodiment.

As shown in FIG. 1A, an oxide buffer layer 104 may be formed on a hydrogen containing layer 102, such as SiNx or SiONx, or combinations thereof, which can include a high hydrogen (H) content. A semiconductor oxide layer 106 is then formed on the oxide buffer layer 104. In an embodiment, the semiconductor oxide layer 106 is formed of a material such as indium gallium zinc oxide (IGZO), however this is merely illustrative, and a variety of other semiconductor oxide materials may be used such as, but not limited to, zinc tin oxide (ZTO) and zinc indium oxide (ZIO). The semiconductor oxide layer 140 may be amorphous. In an embodiment, semiconductor oxide layer 140 is formed using a suitable technique such as sputtering.

A gate dielectric layer 108 may then be formed over the semiconductor oxide layer 106. For example, the gate dielectric layer 120 may be a silicon oxide SiOx layer, formed using a suitable deposition technique such as CVD. A patterned gate layer 110 may then be formed over the gate dielectric layer 108. The gate layer 110 may be a single layer or include a multiple layer stack. In the embodiment illustrated in FIG. 1A, the gate layer 110 includes a bottom metallic gate layer 112 and an upper hydrogen trap layer 114. The bottom metallic gate layer 112 may be formed of a metallic material (e.g. Mo, Ag, Pl, etc.) of good conductivity for ensuring low signal noise and crosstalk. The hydrogen trap layer 114 is formed of both an electrically conductive material, and a material characterized by a negative entropy of solution of hydrogen. Suitable materials include Li, Sc, Y, La, Ce, Ti, Zr, Hf, V, Nb, and Ta. In a specific embodiment, the hydrogen trap layer 114 is formed of Ti.

The various hydrogen trap layers 114 (including dummy layers) described herein may be characterized by a higher hydrogen solubility than the metallic gate layers 112. In a final product, after hydrogen diffusion/outgassing has occurred from surrounding layers, the hydrogen trap layers 114 (e.g. Ti) may include a hydrogen (atom) concentration greater than $1E^{21}/cm^3$ such as greater than $1E^{22}/cm^3$, while an adjacent metallic gate layer 112 (e.g. Mo) has a hydrogen solubility/concentrate less than $1E^{21}/cm^3$. For example, such a concentration gradient may be determined by secondary ion mass spectrometry (SIMS) analysis. An interlayer dielectric (ILD) 120 may then be formed over the gate layer 110 and any underlying layers. ILD 120 may include one or more dielectric layers. In an embodiment, ILD 120 is formed of a material with low hydrogen concentration, such as SiOx, and formed using a suitable deposition technique such as CVD.

Source and drain contact openings are then formed through the ILD 120 to expose the semiconductor oxide layer 106, followed by the formation of a metal layer on the ILD 120 and within the source and drain contact openings to form source/drain contacts 124 (vias) and routing layers 122. Source/drain contacts 124 and routing layers 122 may be formed of a same metal layer, or multiple metal layers. Additional processing and layers are then formed consistent with display manufacturing technology, including additional passivation layer 126, which may be a high hydrogen concentration containing material, such as SiNx, SiONx, etc. It is to be appreciated that while the high hydrogen content passivation layer 126 is illustrated as being immediately on top of the IDL 120 and routing layers 122, that there may be several intermediate layers. The high hydrogen content passivation layer 126 may be a top passivation layer located above the emission layers (e.g. organic emission layer for OLED) in a display panel.

Referring now to FIG. 1B, a double gate oxide transistor 100 structure is illustrated with a similar top gate layer 110 to that of FIG. 1A. As shown, a bottom gate layer 130 may be formed between the hydrogen containing layer 102 and the oxide buffer layer 104. The bottom gate layer 130 in accordance with embodiments may have a variety of configurations and include single or multiple layers. In the particular embodiment illustrated in FIG. 1B, the bottom gate layer 130 includes a metallic gate layer 132 similar to metallic gate layer 112, and a top hydrogen trap layer 134 similar to hydrogen trap layer 114.

In accordance with the embodiments illustrated in FIGS. 1A-1B, an oxide transistor 100 can include a semiconductor oxide layer 106, a gate dielectric layer 108 on the semiconductor oxide layer 106, and a gate layer 110 on the gate dielectric layer 108. In the illustrated embodiments, the gate layer 110 includes a gate hydrogen trap layer 114 and a metallic gate layer 112 in direct contact with the gate hydrogen trap layer 114. More specifically, the metallic gate layer 112 is directly over the gate hydrogen trap layer 114. A double gate oxide transistor 100 structure can further include the bottom gate layer 130 underneath the semiconductor oxide layer 106. In the embodiment illustrated in FIG. 1B, the bottom gate layer 130 includes a bottom gate hydrogen trap layer 134 directly over a bottom metallic gate layer 132.

Figure 2A:
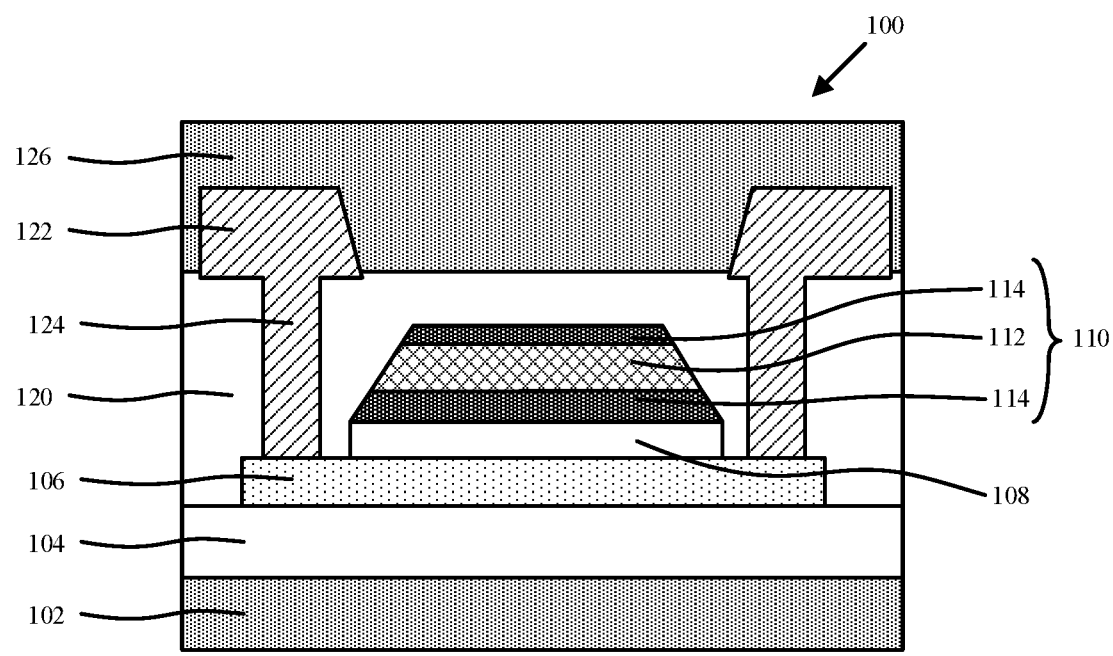
FIG. 2A is a schematic cross-sectional side view illustration of a top gate oxide transistor including multiple gate hydrogen trap layers in accordance with an embodiment.
Figure 2B:
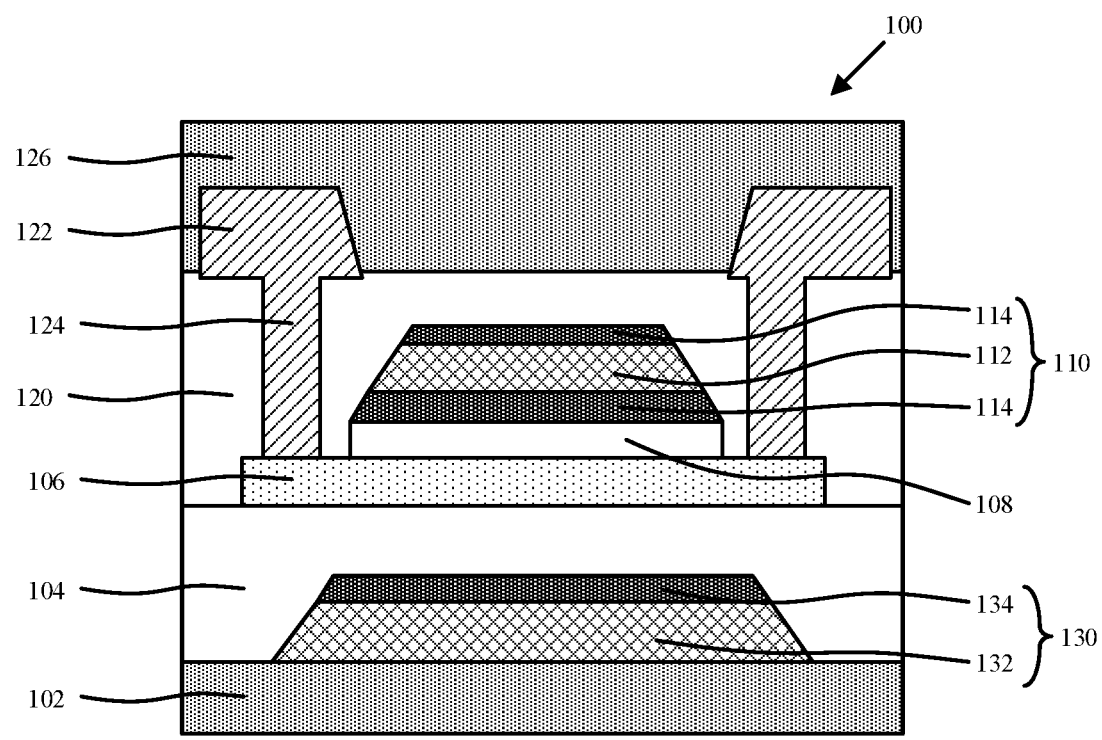
FIG. 2B is a schematic cross-sectional side view illustration of a double gate oxide transistor including multiple gate hydrogen trap layers in the top gate layer in accordance with an embodiment.

The hydrogen trap layers may be incorporated into oxide transistor 100 structures in a variety of different ways. FIG. 2A is a schematic cross-sectional side view illustration of a top gate oxide transistor 100 including multiple gate hydrogen trap layers in accordance with an embodiment. FIG. 2B is a schematic cross-sectional side view illustration of a double gate oxide transistor 100 including multiple gate hydrogen trap layers in the top gate layer in accordance with an embodiment. As illustrated, the embodiments illustrated in FIGS. 2A-2B are similar to those illustrated in FIGS. 1A-1B with the addition of an additional hydrogen trap layer 114 in the top gate 110. Thus, the top gate 110 includes a multiple layer stack in which the metallic gate layer 112 is directly over a gate hydrogen trap layer 114, and a second gate hydrogen trap layer 114 is directly over the metallic gate layer 112. Another variation is shown in the embodiments illustrated in FIGS. 3A-3B in which the hydrogen trap layer 114 is positioned directly over the metallic gate layer 112 in the top gate layer 110.

Figure 4A:
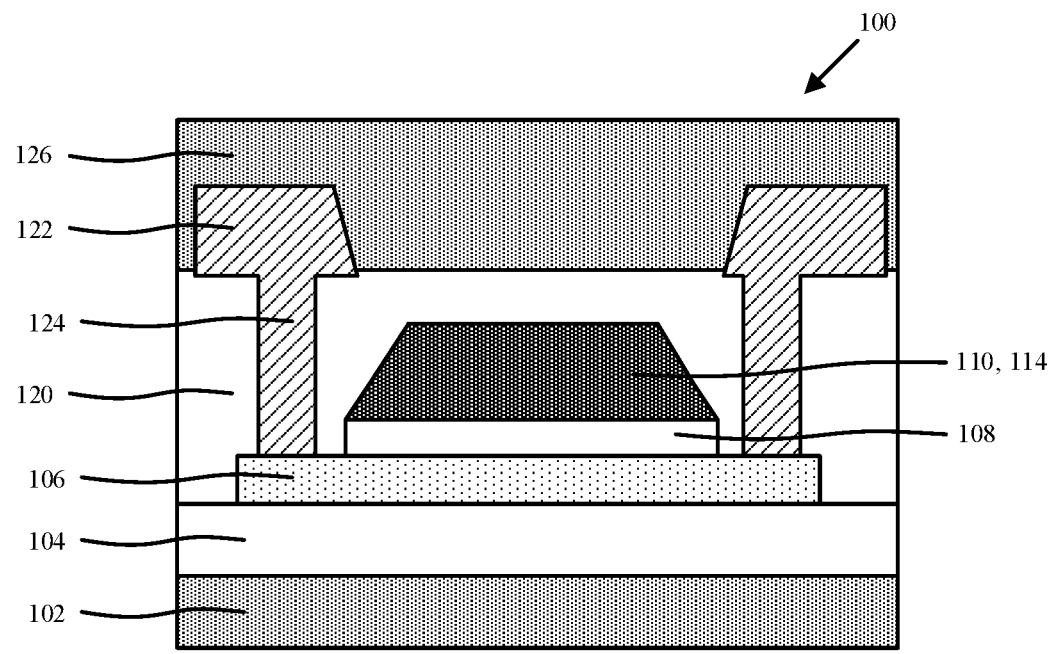
FIG. 4A is a schematic cross-sectional side view illustration of a top gate oxide transistor including an alloyed gate hydrogen trap layer in accordance with an embodiment.
Figure 4B:
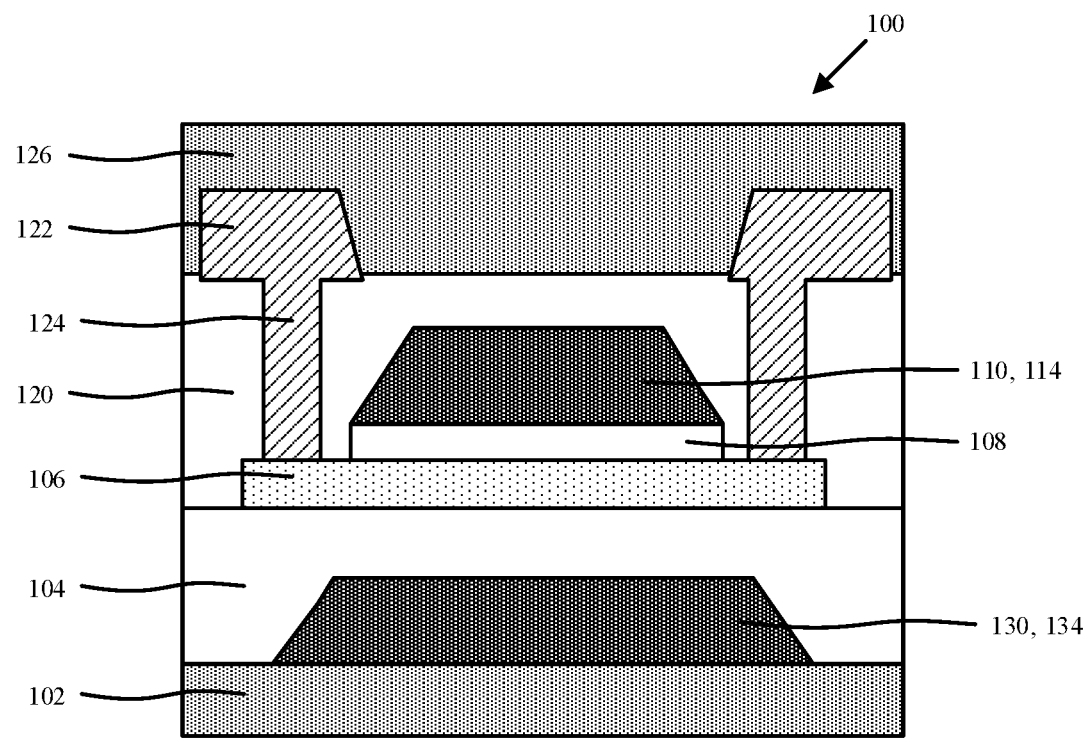
FIG. 4B is a schematic cross-sectional side view illustration of a double gate oxide transistor including alloyed gate hydrogen trap layers in accordance with an embodiment.

Referring now to FIGS. 4A-4B, yet an additional variation of the embodiments is illustrated in which one or both of the top gate layer 110 and bottom gate layer 130 is an alloyed gate layer which includes a hydrogen trap layer 114, 134. Thus, a hydrogen trapping material (e.g. Li, Sc, Y, La, Ce, Ti, Zr, Hf, V, Nb, Ta) may be allowed with a metallic gate layer material (e.g. Mo, Ag, Pl, Al, etc.). For example, an alloyed gate layer 110, 130 may include a Mo—Ti or Al—Ti alloy, or Al alloys with dopants of Ti, Ce, Zr, Hf, Nd, Ta, etc.

Figure 5:
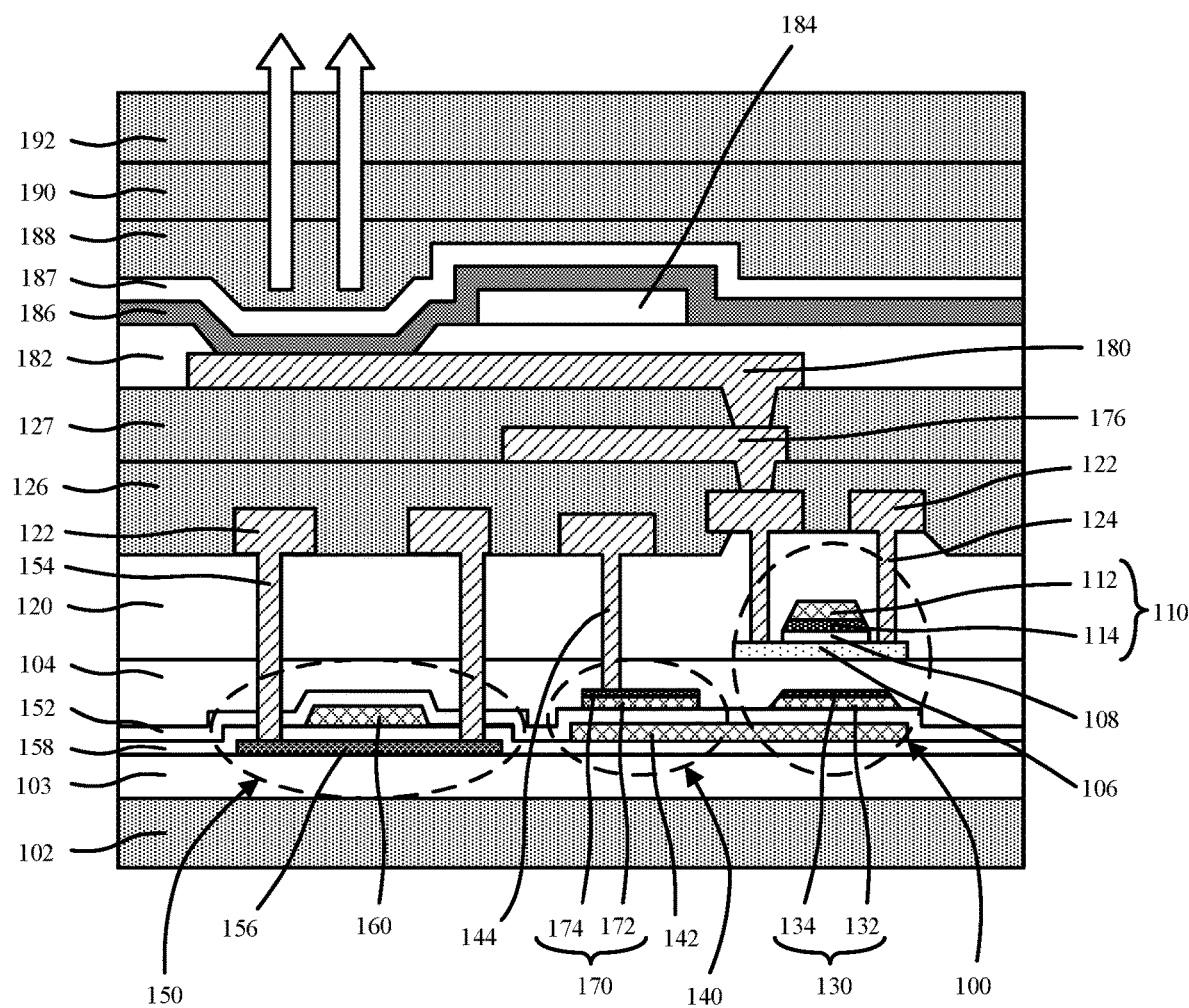
FIG. 5 is a schematic cross-sectional side view illustration of a subpixel including a silicon transistor and an oxide transistor in accordance with an embodiment.

Referring now to FIG. 5 a schematic cross-sectional side view illustration is provided of a hybrid subpixel including a silicon transistor 150 and an oxide transistor 100 in accordance with an embodiment. The particular structure illustrated in FIG. 5 includes the double gate oxide transistor 100 of FIG. 1B, though this is merely exemplary, and any of the other oxide transistor arrangements of FIGS. 1A-4B could be included in the hybrid subpixel structure.

As shown, the hybrid pixel structure can include hydrogen containing layer 102 (e.g. SiNx, SiONx, polyimide, etc.), oxide buffer layer 103 (e.g. SiOx), and silicon channel layer 156 (e.g. polysilicon). A gate dielectric layer 158 is formed over the silicon channel layer 156, followed by the formation of the silicon transistor 150 gate layer 160. Gate layer 160 may be formed of a variety of conductive materials including polysilicon, metallic materials, etc. and may be a multiple layer stack. The same material(s) used to make the gate layer 160 may also be used to form additional conductive layers, which can include a capacitor plate layer 142 which can be used to from a capacitor 140 in the subpixel circuit. In an embodiment, gate layer 160 and/or capacitor plate layer 142 can include a hydrogen trap layer. ILD 152 may then be formed over the gate layer 160 and optional capacitor plate layer 142. ILD 152 may be formed of a suitable insulating material, and may function as the capacitor dielectric layer. Suitable materials include SiOx, $Al_2O_3$, etc.

Bottom gate layer 130 may then be formed as previously described. In an embodiment, the materials used to form the bottom gate layer 130 may also be used to form a top capacitor plate layer 170. For example, this may include a metallic layer 172 and hydrogen trap layer 174. Oxide buffer layer 104 may then be formed as previously described.

Many layers illustrated in FIG. 5 are shown with a level top surface. Thus, these layers may optionally be planarized after deposition.

The remainder of the double gate oxide transistor 100 may be fabricated similarly as previously described with regard to FIGS. 1A-1B. Additionally, the metal layer used to form source/drain contacts 124 and routing layers 122, may also be used to form source/drain contacts 154 and routing layers 122 for the silicon transistor 150, and contact 144 and routing layer 122 for the capacitor 140. In an embodiment either or both of the source/drain contacts or routing layers 122 can include a metal trap layer.

Following the formation of source/drain contacts and routing layers 122 additional build-up structures can be formed, including routing layer 176 and passivation layers 126, 127, (e.g. planarization layers) which may or may not be hydrogen diffusion/outgassing sources. In an embodiment, routing layer 176 may include a plate of a capacitor structure. The fabrication sequence may then proceed with formation of anode 180, followed by a patterned bank layer 182, and spacer 184, followed by deposition of the organic layer(s) 186 and cathode 187 (e.g. indium tin oxide, etc.). Additional passivation layers 188, 190, 192 may then be formed. In accordance with embodiments, any of the passivation layers 188, 190, 192 may be hydrogen containing layers for hydrogen diffusion/outgassing.

Figure 6A:
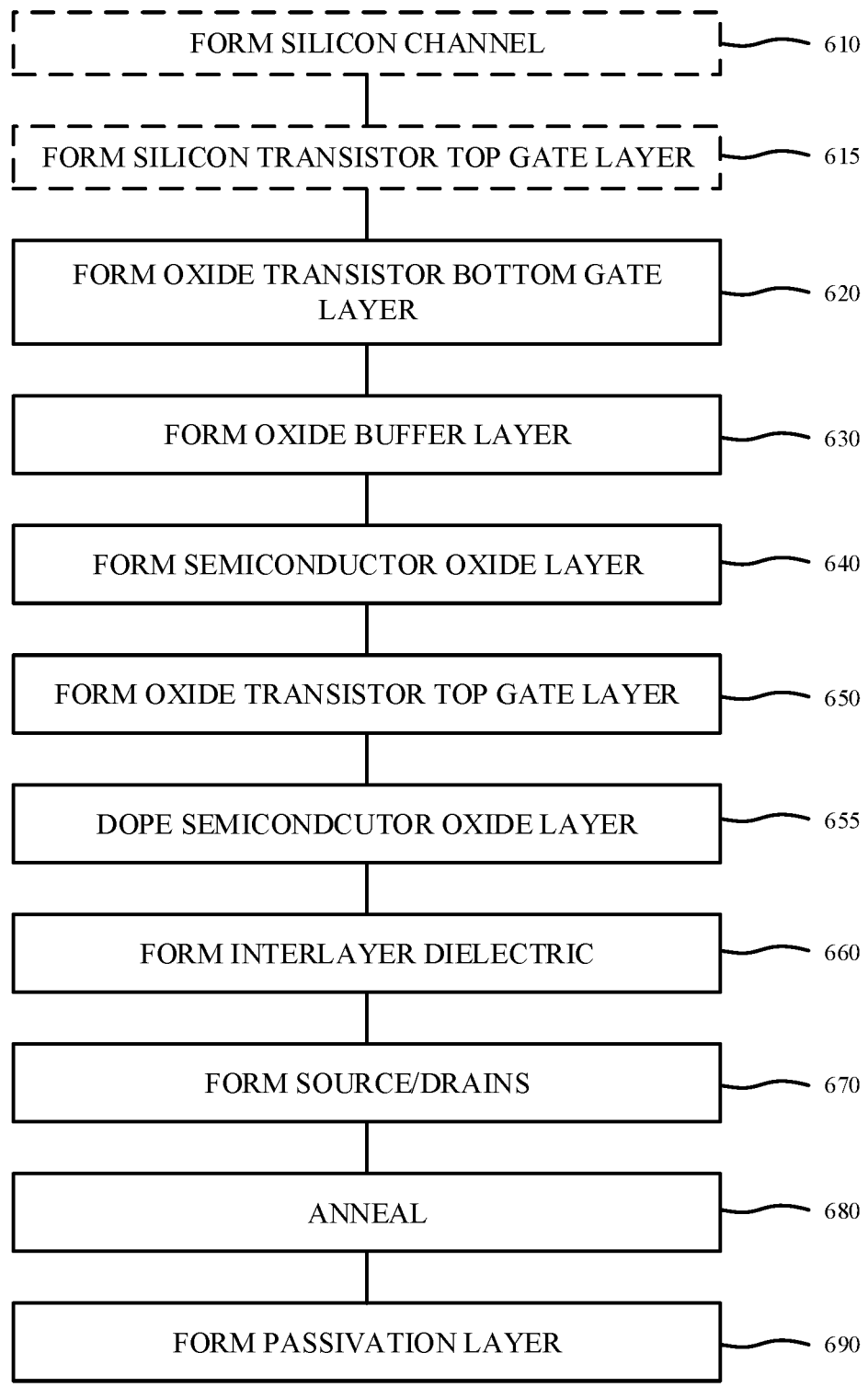
FIG. 6A is a flow chart of a method of forming an oxide transistor with doped source/drain junctions in accordance with an embodiment.
Figure 6B:
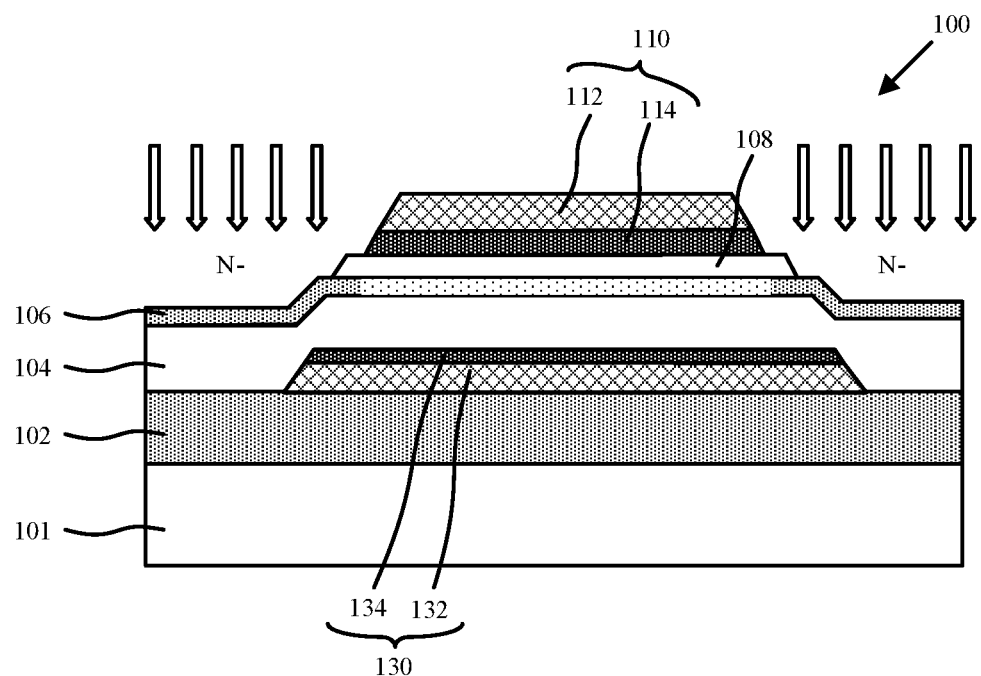
FIG. 6B is a schematic cross-sectional side view illustration of an oxide transistor with doped source/drain junctions after source/drain plasma treatment and prior to anneal in accordance with an embodiment.
Figure 6C:
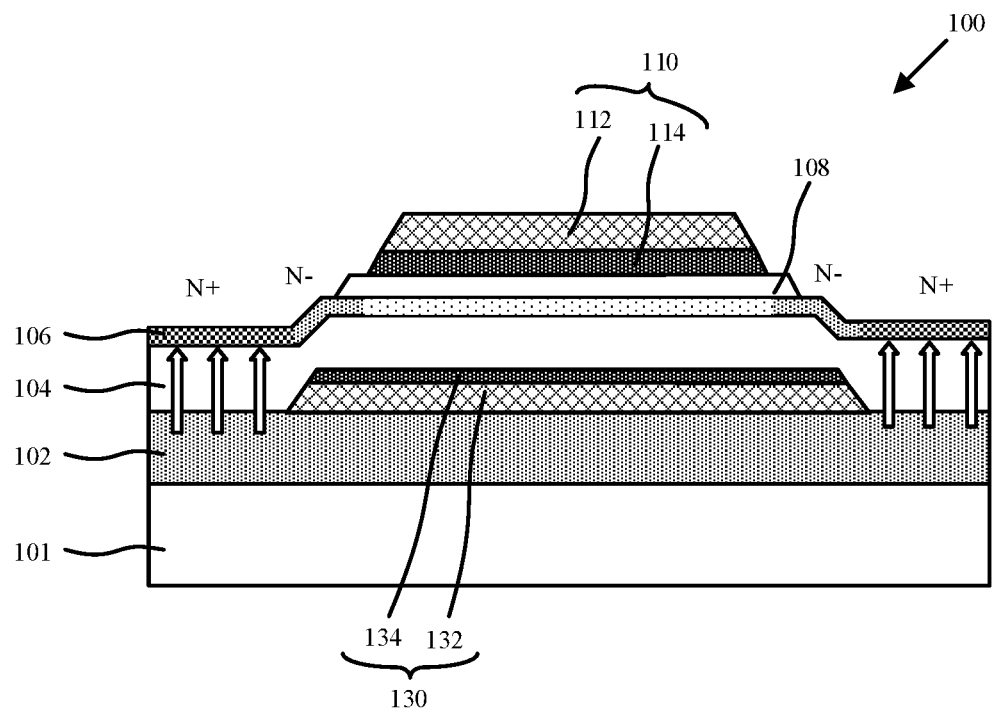
FIG. 6C is a schematic cross-sectional side view illustration of an oxide transistor with doped source/drain junctions after anneal in accordance with an embodiment.

Referring now to FIGS. 6A-6C, FIG. 6A is a flow chart of a method of forming an oxide transistor with doped source/drain junctions in accordance with an embodiment. FIG. 6B illustrates the oxide transistor after source/drain plasma treatment and prior to anneal, while FIG. 6C is illustrates the oxide transistor after annealing. In interest of completion, the following description processing sequence of FIG. 6A and the oxide transistor structures of FIGS. 6B-6D is made with reference to the hybrid transistor structure of FIG. 5.

At operation 610 a silicon channel of the silicon channel layer 156 of the silicon transistor 150 is formed, followed by formation of the silicon transistor 150 top gate layer 160 at operation 615. Referring now to both FIG. 5 and FIGS. 6B-6C, at operation 620 the oxide transistor 100 bottom gate 130 is formed. Similar to the structures of FIGS. 1A-4B, it is to be appreciated that not all layers may be illustrated in the illustrations of FIGS. 6B-6C, and some layers may be omitted (such as those illustrated in FIG. 5, and not shown in FIGS. 6B-6C). Similar to the processes described with regard to FIGS. 1A-1B, an oxide buffer layer 104 is formed over the bottom gate 130 at operation 630, and the semiconductor oxide layer 106 is formed over the oxide buffer layer 104 at operation 640. After formation of the gate dielectric layer 108, the oxide transistor 100 top gate layer 110 is formed at operation 650.

Referring now to FIG. 6B, at operation 655 a doping process plasma treatment is performed to accomplish top-down doping of the exposed portions of the semiconductor oxide layer 106. For example, this can be a plasma treatment, or ion implantation such as with Ar or He. In an embodiment, a nitrogen plasma treatment is performed to create N– doping of the exposed portion of the semiconductor oxide layer 106. The top gate 110 (or mask layer thereon) may be used to mask the doping concentration. Following plasma treatment, the ILD 120 may be formed over the top gate layer 110 and underlying structure at operation 660, followed by the formation of source/drain contacts 124 at operation 670. Referring briefly to FIG. 5, this may optionally include formation of source/drain contacts 154 for the silicon transistor 150 and contact 144 for the capacitor plate layer 170.

An anneal procedure is then formed at operation 680. The anneal procedure may have dual purposes. In one aspect, the anneal may be used for contact formation of the source/drain contacts 154 to transistor source/drains, and in particular poly-silicon source/drain in the silicon channel layer 156 of the silicon transistor 150. In addition, the anneal may drive hydrogen diffusion from the bottom hydrogen containing layer 102 (e.g. SiNx, SiONx) toward the semiconductor oxide layer 106 of the oxide transistor 100. In the particular configuration illustrated in FIG. 6C, the bottom gate layer 130 blocks hydrogen diffusion from the channel region of the semiconductor oxide layer 106, as well as from N− doped regions in the shadow of the bottom gate layer 130. As a result, the bottom-up diffusion of hydrogen preferentially dopes the regions of the semiconductor oxide layer 106 outside of the shadow of the bottom gate layer 130 to form N+ regions. Passivation layer 120 may then be formed at operation 690, followed by additional processing sequences as already described. In an embodiment, it is to the N+ regions that the source/drain contacts 124 will be made.

In accordance with embodiments, a hydrogen trap layer 114, 134, etc. can be formed in a variety of locations to block hydrogen diffusion toward the semiconductor oxide layer 106 channel region. In the embodiment illustrated in FIGS. 6B-6C (as well as other embodiments), the bottom gate layer 130 has a wider gate width than the top gate layer 110. In this structure, the wider width of the bottom gate layer 130 can shield the channel region within the shadow of the bottom gate layer 130 from bottom-up hydrogen diffusion from a lower layer. Furthermore, the width of the bottom gate layer 130 (including the hydrogen trap layer 134) can be tailored to control N+/N-doping junctions in the semiconductor oxide layer 106. In the embodiment illustrated in FIG. 6C, presence of the lower gate layer 130 can cause a step height in the semiconductor oxide layer 106 such that the channel region is in a planar region directly above the bottom gate layer 130, and the N+ regions are a step below the channel region. The N− regions may span the step portion of the semiconductor oxide layer 106.

It is to be appreciated that the N−/N+ regions can also be formed by hydrogen diffusion from upper/lower hydrogen containing layers and thermal treatments. For example, in addition to plasma treatments, N− regions can be formed by H diffusion from an overlying layer, including but not limited to, hydrogen containing passivation layers 126, 127, while N+ regions are formed by additional diffusion from hydrogen containing layer 102 as previously described. Hydrogen doping can be accomplished in a variety of sequences, in which the N−/N+ regions and concentrations are self-aligned with the top gate layer 110 and bottom gate layer 130. N− hydrogen doping may also be accomplished with plasma treatment or diffusion from a temporary hydrogen containing layer (e.g., SiNx or SiONx).

In an embodiment, a display panel includes a pixel area including an array of subpixels, with each subpixel including an oxide transistor 100 that includes a bottom gate layer 130, an oxide buffer layer 104 on the bottom gate layer 130, a semiconductor oxide layer 106 on the oxide buffer layer 104, a gate dielectric layer 108 on the semiconductor oxide layer 106, and a top gate layer 110 on the gate dielectric layer 108. In such an embodiment, the bottom gate layer 130 has a wider gate width than the top gate layer 110. As shown in FIG. 6C, a first portion of the semiconductor oxide layer 106 directly underneath a shadow of the top gate layer 110 corresponds to the oxide transistor channel. A second portion of the semiconductor oxide layer 106 that is directly over a shadow of the bottom gate layer 130, and does not include the first portion, is N− doped. A third portion of the semiconductor oxide layer 106 outside the shadow of the bottom gate layer is N+ doped. In an embodiment, the N− doped to N+ doped interface is characterized by a (higher) hydrogen dopant concentration in the third portion. For example, the third portion (N+ region) may have a higher hydrogen dopant concentration than the second portion (N− region) of the semiconductor oxide layer 106.

Figure 7:
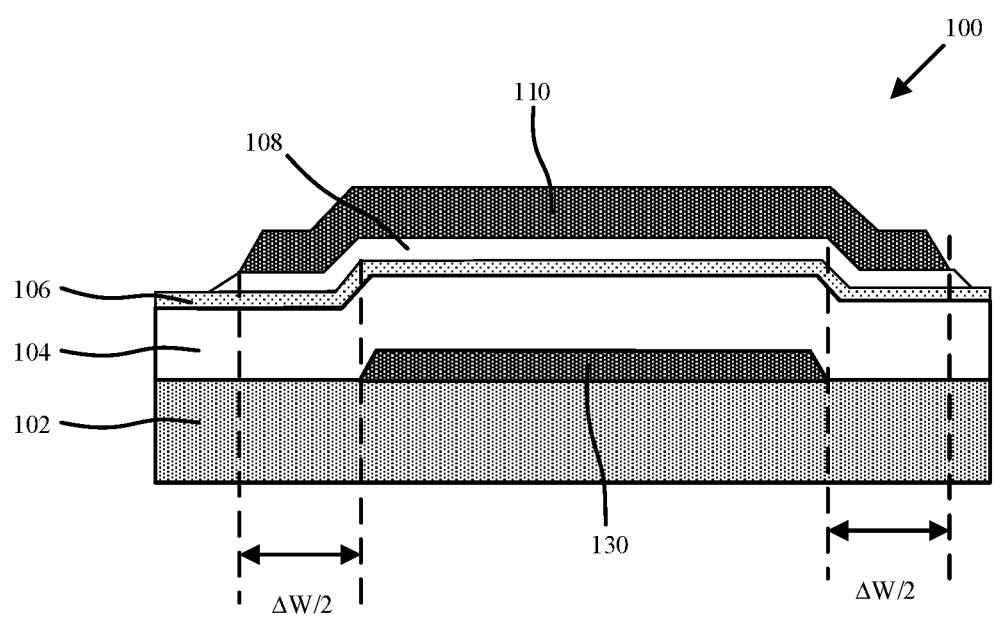
FIG. 7 is a schematic cross-sectional side view illustration of a double gate oxide transistor including a protective top gate layer in accordance with an embodiment.

Similar to the bottom gate 130 being utilized to block hydrogen diffusion from a lower hydrogen diffusion source, the top gate 110 can also be utilized to block hydrogen diffusion from an upper hydrogen diffusion source, while optionally also provide lateral protection. FIG. 7 is a schematic cross-sectional side view illustration of a double gate oxide transistor including a protective top gate layer 110 in accordance with an embodiment. While only a single top gate layer 110 is illustrated, it is to be appreciated that both the top gate layer 110 and bottom gate layer 130 can have multiple layers and include separate hydrogen trap layer(s) as previously described. In the embodiment illustrated the oxide transistor 100 includes a bottom gate layer 130, an oxide buffer layer 104 on the bottom gate layer 130, a semiconductor oxide layer 106 on the oxide buffer layer 104, a gate dielectric layer 108 on the semiconductor oxide layer 106, and a top gate layer 110 on the gate dielectric layer 106. In such an embodiment, the top gate layer 110 has a wider gate width (W) than the bottom gate layer 110 by a difference ($\Delta W$). In an embodiment, the top gate layer 110 includes a gate hydrogen trap layer characterized by a negative entropy of solution of hydrogen. The gate hydrogen trap layer may be a separate layer or an alloyed layer as previously described. In an embodiment, the top gate layer includes a gate hydrogen trap layer (e.g. 114) in direct contact with a metallic gate layer (e.g. 112), where the gate hydrogen trap layer is characterized by a negative entropy of solution of hydrogen. In the embodiment illustrated in FIG. 7, the outside edges of the top gate layer 110 step down from the interior portion of the top gate layer. Such an arrangement may provide some additional protection against lateral hydrogen diffusion, as well as further protection from hydrogen diffusion from an upper layer by further isolating the semiconductor oxide layer channel region, which is in the shadow of the bottom gate layer 130. In an embodiment, the difference in gate widths $\Delta W/2$ on each side are 1-2 µm.

Figure 8A:
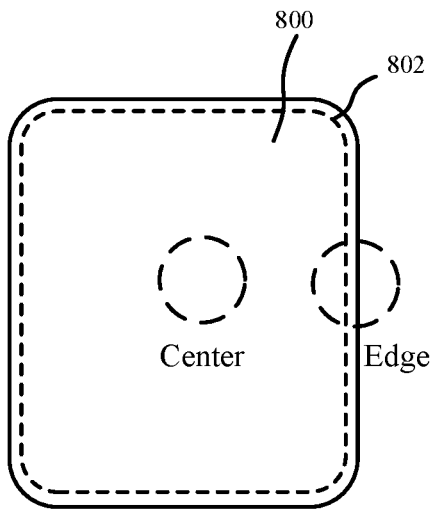
FIG. 8A is a schematic top view illustration of a display panel in accordance with an embodiment.
Figure 8B:
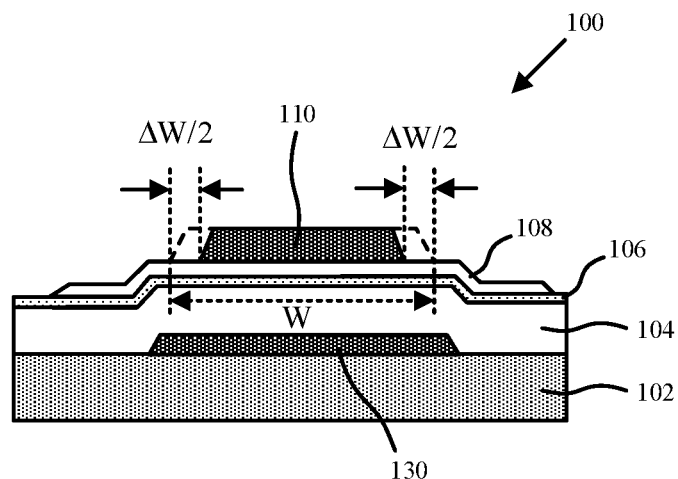
FIG. 8B is a schematic cross-sectional side view illustration of a double gate oxide transistor with variable top gate layer width in accordance with an embodiment.
Figure 8C:
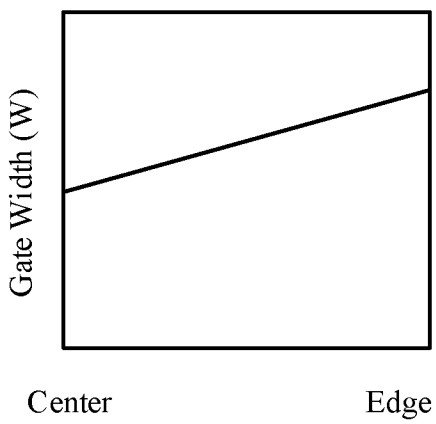
FIG. 8C is a plot of continuous variation of double gate oxide transistor gate width from center to edge of a display panel in accordance with an embodiment.
Figure 8D:
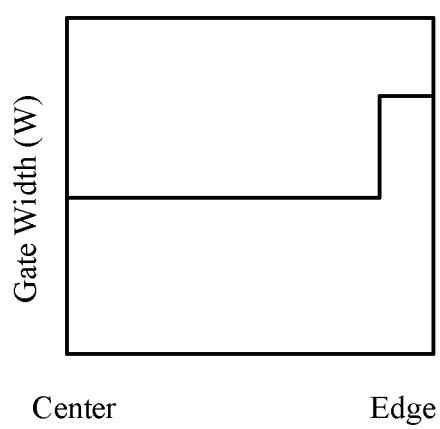
FIG. 8D is a plot of discontinuous variation of double gate oxide transistor gate width from center to edge of a display panel in accordance with an embodiment.

Up until this point, transistor gate structures have been described in which hydrogen trap layers can be located in various places, and the gate layer widths can be adjusted to block hydrogen diffusion from specific directions. It has additionally been observed that hydrogen diffusion from the display panel edges can be particularly problematic and adversely affect pixels nearest the display panel edges. In accordance with some embodiments, the gate layer widths can be modulated between the center location and edge locations of the display panel. FIG. 8A is a schematic top view illustration of a display panel 800 including center area and edge area in accordance with an embodiment. FIG. 8B is a schematic cross-sectional side view illustration of a double gate oxide transistor 100 with variable top gate layer 110 width in accordance with an embodiment. FIG. 8B is similar to previous double gate oxide transistor structures described and illustrated with regard to FIGS. 1B, 2B, 3B, 4B. In accordance with embodiments, the top gate layer 110 width (W) can be modulated to block hydrogen diffusion depending upon the transistor location in the display panel 800. For example, in the embodiment illustrated in FIG. 8C, the gate layer width (W) can be continuously modulated from the center to edge, with a larger gate layer 110 width at the edge of the display panel. In the embodiment illustrated in FIG. 8D, modulation need not be continuous and can be step-wise.

Figure 3A:
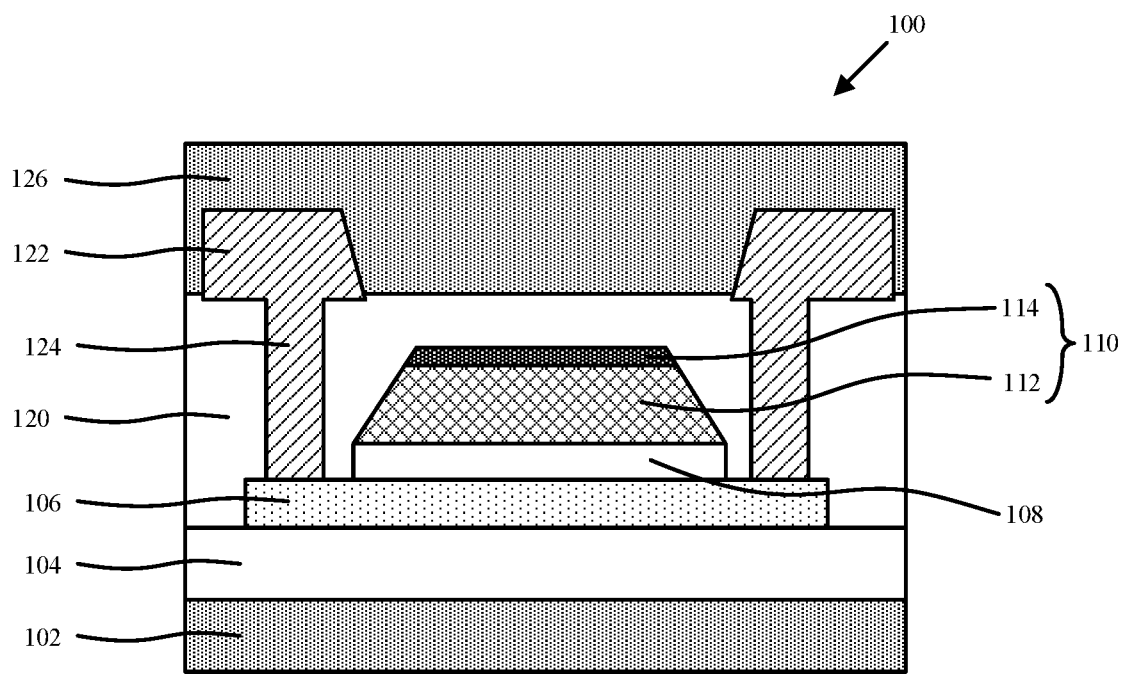
FIG. 3A is a schematic cross-sectional side view illustration of a top gate oxide transistor including an upper gate hydrogen trap layer in accordance with an embodiment.
Figure 3B:
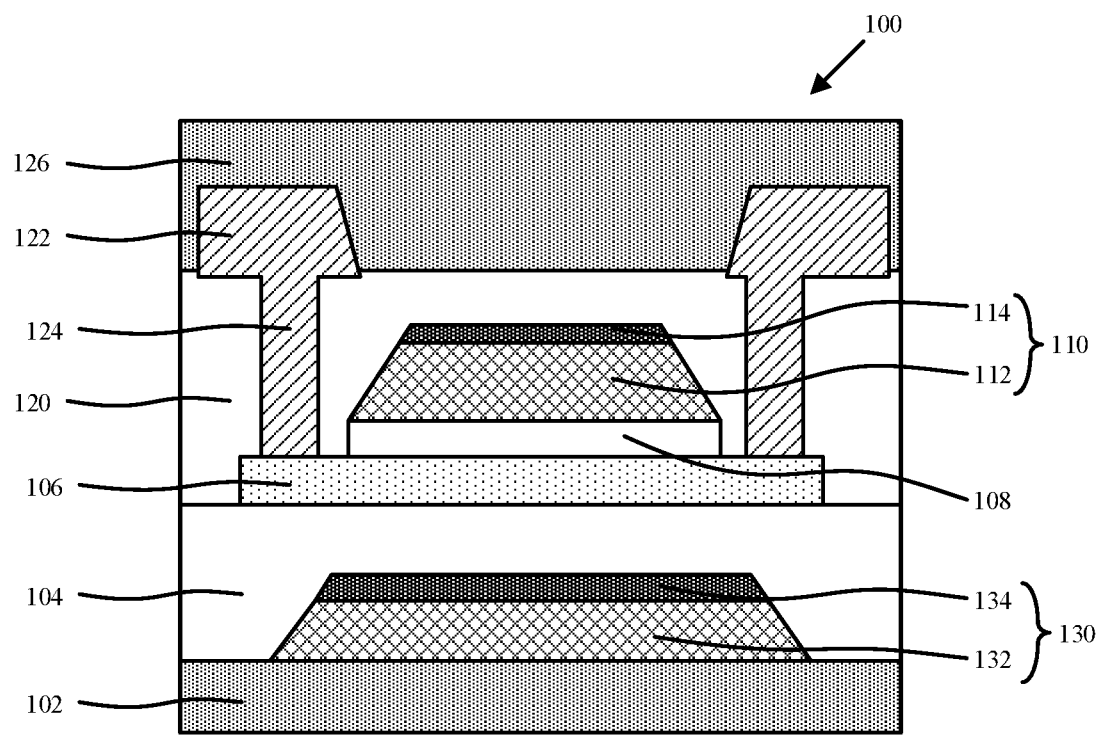
FIG. 3B is a schematic cross-sectional side view illustration of a double gate oxide transistor including an upper gate hydrogen trap layer in the top gate layer in accordance with an embodiment.

In an embodiment, a display panel 800 includes a pixel area 802 including an array of subpixels, each subpixel including an oxide transistor 100 gate layer 110 that includes a gate hydrogen trap layer. In such an embodiment, a gate width (W) of the gate layer 110 is the smallest for subpixels nearest a center of the pixel area, and the gate width (W) of the gate layer 110 is the widest for subpixels nearest a periphery of the pixel area. A variety of configurations of oxide transistors 100 can be used with such a modulation structure. In an embodiment, each oxide transistor 100 includes a semiconductor oxide layer 106, a gate dielectric layer 108 on the semiconductor oxide layer 106, and the gate layer 110. The gate layer 110 may include a gate hydrogen trap layer 114 and a metallic gate layer 112 in direct contact with the gate hydrogen trap layer 114. The metallic gate layer 112 may be directly over the gate hydrogen trap layer 114 (e.g. as illustrated in FIGS. 1A-1B) or directly under the gate hydrogen trap layer 114 (e.g. as illustrated in FIGS. 3A-3B). In an embodiment, gate hydrogen trap layers 114 are directly under and directly over the metallic gate layer 112 in a stacked arrangement, such as that illustrated in FIGS. 2A-2B. In some embodiments, the oxide transistor 100 includes a bottom gate layer 130 underneath the semiconductor oxide layer 106. Similarly, the bottom gate layer 130 may include a bottom gate hydrogen trap layer 134 directly over a bottom metallic gate layer, 132 for example. In accordance with embodiments, the top gate layer 110. In an embodiment, the bottom gate layer 130 has a wider gate width (W) than the top gate layer 110 for subpixels nearest the center and the periphery of the pixel area. In an alternative embodiment, the top gate layer 110 has a wider gate width (W) than the bottom gate layer 130 for subpixels nearest the center and the periphery of the pixel area (e.g. modulation of the oxide transistor structure of FIG. 7). Additionally, while the above description has been illustrated with regard to modulation of the top gate layer 110 gate width, the bottom gate layer 130 gate width may alternatively be modulated, or both modulated.

Figures 9A, 9B, 9C:
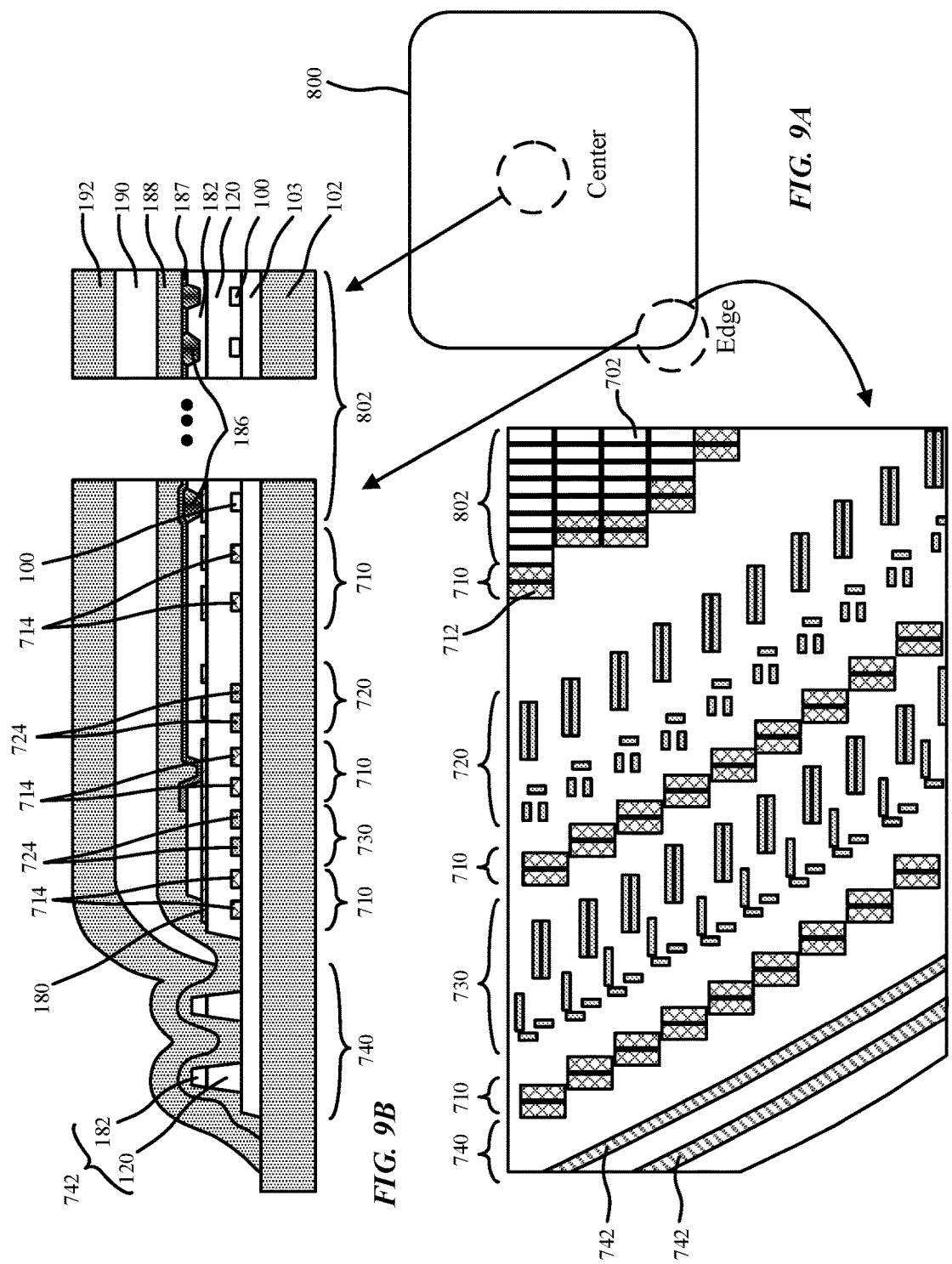
FIG. 9A is a schematic top view illustration of a display panel in accordance with an embodiment.
FIG. 9B is a schematic cross-sectional side view illustration of a display panel including dummy subpixels in accordance with an embodiment.
FIG. 9C is a schematic top view illustration of a display panel including dummy subpixels in accordance with an embodiment.

In yet another aspect, embodiments may include dummy pattern designs to macro-manage hydrogen diffusion in the display panel. In such an arrangement the dummy subpixels can be used as shields for the pixel area, as well as for GIP areas. FIG. 9A is a schematic top view illustration of a display panel 800 including a center area and edge area in accordance with an embodiment. FIG. 9B is a schematic cross-sectional side view illustration spanning both the center area and edge area of FIG. 9A and including dummy subpixels in accordance with an embodiment. FIG. 9C is a schematic top view illustration of the edge area of the display panel 800 including the dummy subpixels in accordance with an embodiment. In the particular embodiment illustrated, hydrogen containing layer 102 and passivation layers 188, 192 are shaded to show high hydrogen concentration, and the propensity for hydrogen diffusion from the edges. Referring to FIG. 9B specifically, from center to edge, different areas identified are the pixel area 802, dummy area 710 including dummy transistors 714, first GIP area 720 which may optionally include active oxide transistors 724, dummy area 710, second GIP area 720 which may optionally include active oxide transistors 724, dummy area 710, and a dam area 40 including dam structures 742.

As shown in FIGS. 9A-9C, the pixel area 802 can span from the center to edge of the display panel 800. A dummy area 710 including dummy subpixels 712 can be located at the edge boundary of the active pixel area 802. The dummy subpixels 712 may be non-functional, and may not have an organic emission layer (e.g. 186). Furthermore, the dummy subpixels 712 may have a similar layout and symmetry as the active subpixels 702 so as to not introduce stresses to the system. Thus, the dummy subpixels 712 may mimic the metal routings, gate, and capacitance in the active subpixels 702 to reduce loading effect and process variations. Dummy subpixels 712 may additionally include a higher concentration of hydrogen trap layer material compared to the active subpixels 702.

In an embodiment, a display panel 800 includes a GIP area 720 (or 730) adjacent an edge of the display panel 800. The pixel area 802 includes an array of subpixels 702, with each subpixel including an oxide transistor 100 that includes a transistor hydrogen trap layer formed of a transistor material characterized by a negative entropy of solution of hydrogen. A dummy subpixel area 710 is located between the GIP area 720 and the pixel area 802, and the dummy subpixel area 710 includes a plurality of dummy subpixels 712, with each dummy subpixel 712 including a dummy hydrogen trap layer formed of a dummy material characterized by a negative entropy of solution of hydrogen. In an embodiment, each dummy subpixel 712 includes a volume of dummy hydrogen trap layer dummy material that is larger than a volume of hydrogen trap layer material in each subpixel. The dummy hydrogen trap layer dummy material and the hydrogen tram layer material may be the same material, such as Li, Sc, Y, La, Ce, Ti, Zr, Hf, V, Nb, and Ta.

In an embodiment, the dummy subpixels 712 are symmetrically arranged around an entire periphery of the pixel area 802. The dummy hydrogen trap layer may located in a variety of locations for each dummy subpixel. Exemplary locations can include a dummy oxide transistor gate layer, a dummy capacitor layer, a dummy plate, and a dummy source/drain routing layer.

Referring now to FIG. 9D, a schematic top plan view is provided of certain layers within an active subpixel 702 in accordance with an embodiment. FIGS. 9E-9G are schematic top plan views of specific layers within dummy subpixels in accordance with embodiments to illustrated exemplary locations of the dummy hydrogen trap layer dummy material.

Referring now to the hybrid transistor structure of FIG. 5 in combination with FIG. 9D, an exemplary active subpixel 702 can include Vdd (power) 754 and Vdata (data) lines 756. For example, these may correspond to source/drain routing layers 122 illustrated in FIG. 5. Additional routing layers include scan lines 750, emission control lines 752, amongst others that are not illustrated, and may be included in various routing layers. Also illustrated are the oxide transistor gate layers 110, 130, and source/drain routing layers 122.

Referring now to the dummy subpixel 712 in FIG. 9E, various routing layer are removed such as the scan lines 750, emission control lines 752, etc. In this case the top gate layer 110 and/or bottom gate layer 130 containing the dummy hydrogen trap layer is retained. Optionally, capacitor plate layer 170 containing the dummy hydrogen trap layer is retained. Referring to the dummy subpixel 712 in FIG. 9F, the source/drain routing layers 122 containing the dummy hydrogen trap layer are retained. In the embodiment illustrated in FIG. 9G, the routing layer 176 is retained and includes a dummy hydrogen trap layer. In an embodiment, routing layer 176 includes a plate from a capacitor structure. Likewise, the source/drain routing layers 122 can also include a plat form a capacitor structure. It is to be appreciated that the embodiments of FIGS. 9E-9G are illustrated separately to illustrate the retention of dummy hydrogen trap layers in different layers of the subpixel stack-up. It is to be appreciated that these embodiments may be combined in any suitable manner and are not exclusive of one another. Thus, any combination of the illustrated dummy hydrogen trap layers is contemplated.

Figure 9H:
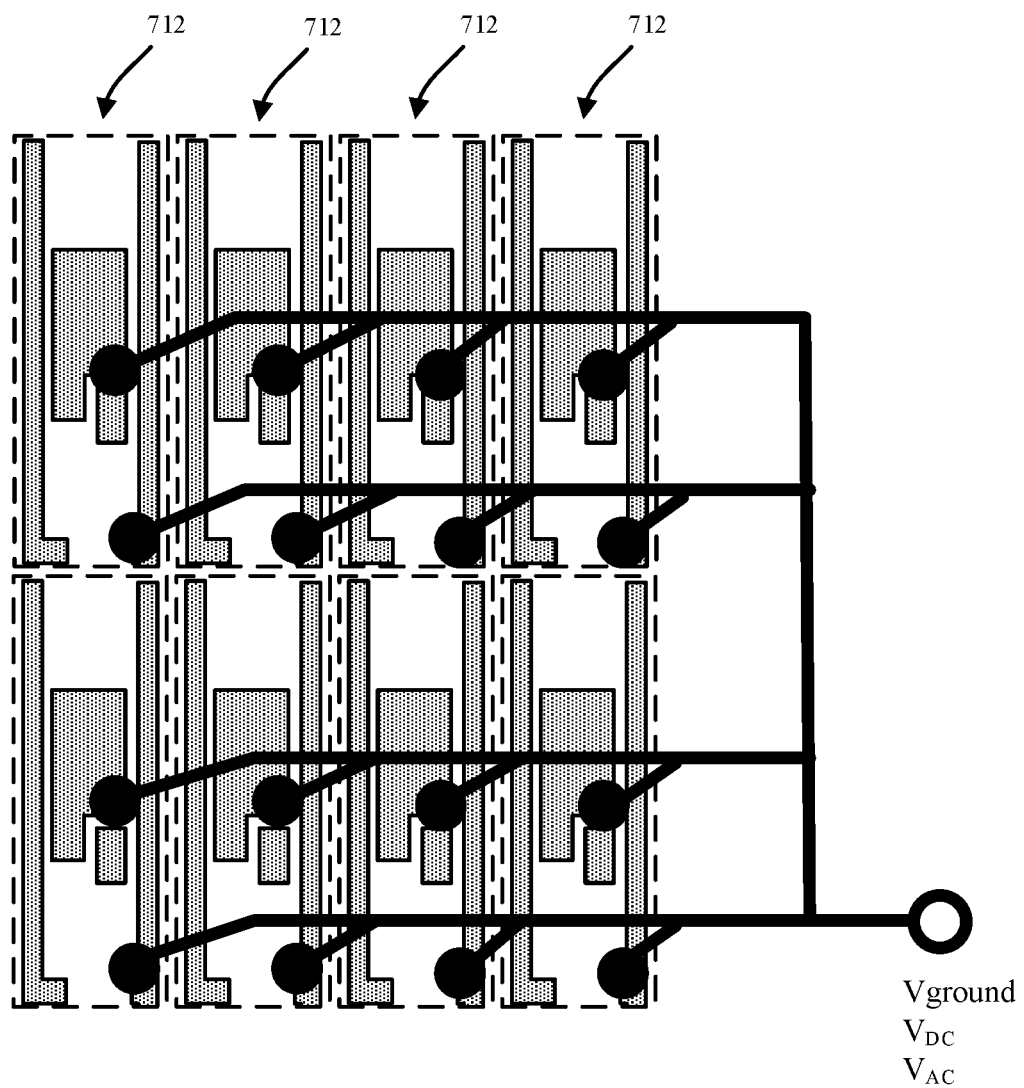
FIG. 9H is a schematic top plan view illustration of a group of mutually connected dummy subpixels in accordance with an embodiment.

The dummy subpixels 712 within the dummy area 710 can either be floating or mutually connected. FIG. 9H is an illustration of a group of dummy subpixels 712 within a dummy area 710 being mutually connected. The dummy subpixels 712 illustrated in FIG. 9H are intended to be generic, and may be any of the dummy subpixels 712 described. In an exemplary passive driving mode, the dummy hydrogen trap layers within the dummy subpixels 712 may be mutually connected to ground (Vground). In an exemplary active driving mode, the dummy hydrogen trap layers within the dummy subpixels 712 may be mutually connected to a control voltage such as constant direct current $V_{DC}$ or alternating current $V_{AC}$. In this configuration the applied voltage may attract hydrogen ions.

Figure 10A:
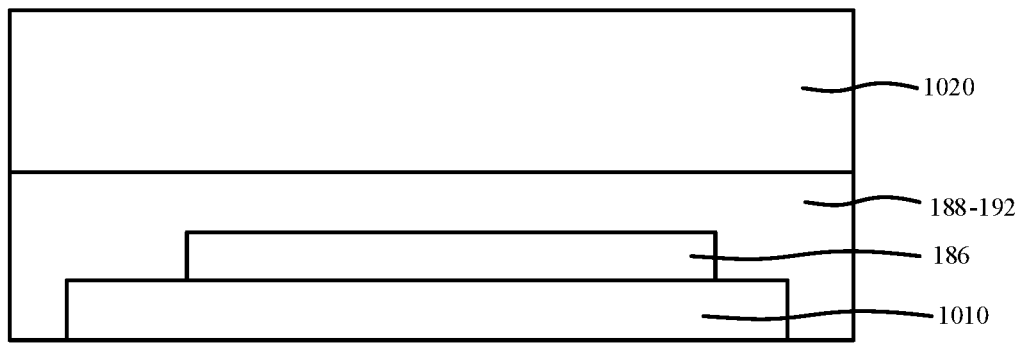
FIG. 10A is a schematic cross-sectional side view illustration of a display system including a touch layer in accordance with an embodiment.
Figure 10B:
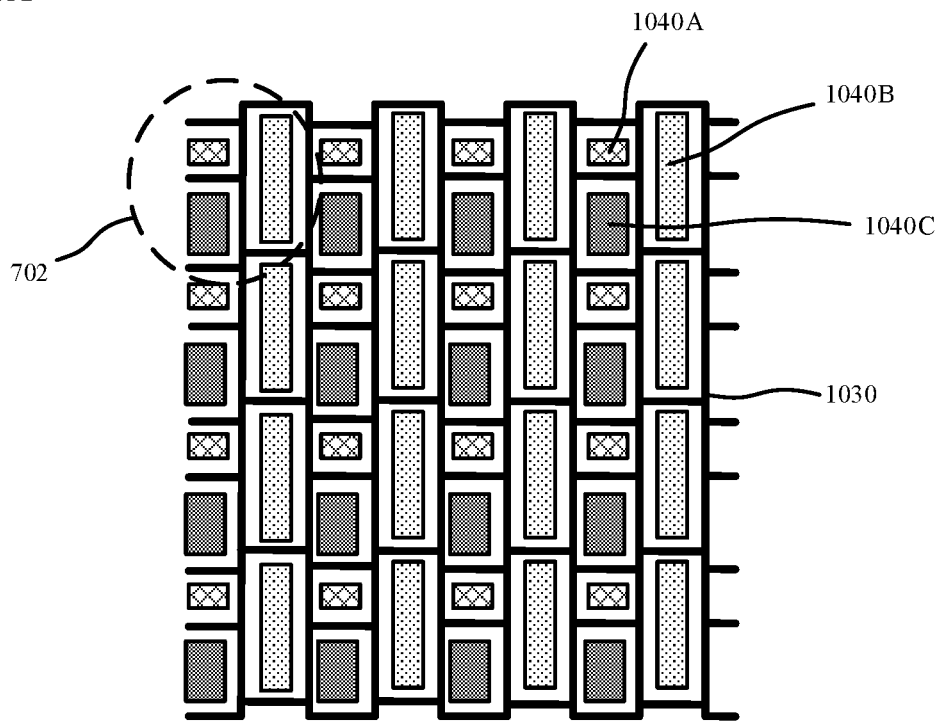
FIG. 10B is a schematic top view illustration of a touch metal routing between subpixels in accordance with an embodiment.
Figure 10C:
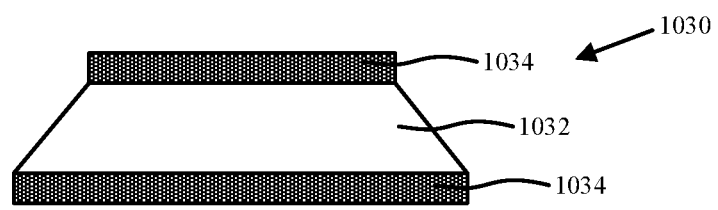
FIG. 10C is a schematic cross-sectional side view illustration of a touch metal routing stack-up in accordance with an embodiment.

In another aspect, metal routings for touch can also be utilized for hydrogen gettering. FIG. 10A is a schematic cross-sectional side view illustration of a display system including a touch layer in accordance with an embodiment. As illustrated, the display system includes the display panel stack-up layers 1010 beneath the organic emission layer 186, and passivation layer(s) 188-192. A touch layer 1020 can be located on the passivation layer 188, as opposed to being a separate touch panel. The touch layer 1020 can include a touch metal routing 1030, as illustrated in FIG. 10B, that weaves between the subpixel emission areas 1040A, 1040B, 1040C, but is not directly above an emission area for the various subpixels A, B, C. It is understood a particular subpixel and pixel arrangement is illustrated, though this is exemplary and a variety of subpixel and pixel arrangements are possible. As shown in FIG. 10C, the touch metal routing 1030 may include a layer stack including one or more hydrogen trap layers 1034 and electrically conductive layer 1032.

In utilizing the various aspects of the embodiments, it would become apparent to one skilled in the art that combinations or variations of the above embodiments are possible for integrating hydrogen trap layers into a display structure. For example, multiple embodiments may be incorporated with the hybrid transistor subpixel structure of FIG. 5. In an embodiment, a hybrid thin film transistor structure includes a substrate (e.g. including hydrogen containing layer 102), an oxide buffer layer over the substrate, the oxide buffer layer 103 spanning a silicon transistor 150 region and an oxide transistor 130 region, a silicon channel layer 156 (e.g. LTPS) over the oxide buffer layer 103 in the silicon transistor region, a gate dielectric layer 158 over the silicon channel layer 156 in the silicon transistor region, and a top gate layer 160 over the gate dielectric layer 158 in the silicon transistor region. This portion of the hybrid structure may be descriptive of a silicon transistor 150.

A bottom gate layer 130 is located over the oxide buffer layer 103 in the oxide transistor region. A second oxide buffer layer 104 is over the bottom gate layer 130 in the oxide transistor region, with the second oxide buffer layer 104 spanning the silicon transistor region and an oxide transistor region. A semiconductor oxide layer 106 is located over the second oxide buffer layer 104 in the oxide transistor region, with a second gate dielectric layer 108 over the semiconductor oxide layer 106 in the oxide transistor region, and a second top gate layer 110 is over the second gate dielectric layer 108 in the oxide transistor region. This portion of the hybrid structure may be descriptive of a double gate oxide transistor 100.

The top gate layer 110 in accordance with embodiments may include a multiple layer stack. For example, the multiple layer stack may include a metallic gate layer 112 and a gate hydrogen trap layer 114 that is characterized by a negative entropy of solution of hydrogen. For example, the gate hydrogen trap layer 114 may include, or be formed essentially of, a hydrogen trapping material such as Li, Sc, Y, La, Ce, Ti, Zr, Hf, V, Nb, and Ta. In the illustrated configuration the metallic gate layer 112 is over the gate hydrogen trap layer 114, though other configurations are contemplated. In an embodiment, the metallic gate layer 112 includes Mo layer, and the gate hydrogen trap layer 114 includes a Ti layer. In an embodiment, the hydrogen trap layer 114 includes a hydrogen concentration greater than $1E^{21}/cm^3$.

An ILD layer 152 may be formed over the top gate layer 160 of the silicon transistor 150, and span both the silicon transistor region and the oxide transistor region, where the bottom gate layer 130 of the double gate oxide transistor 100 is over then ILD layer 152 in the oxide transistor region.

In an embodiment, the substrate includes a hydrogen containing layer 102, and a hydrogen containing planarization layer (e.g. passivation layers 126, 127) is located over the second top gate layer 110 and spans the silicon transistor region and an oxide transistor region. The various structures in accordance with embodiments can include hydrogen trap layers to protect the semiconductor oxide layer of the oxide transistor 100 from hydrogen diffusion from such layers, as well as other hydrogen source layers.

The hybrid thin film transistor structure in accordance with embodiments may include a first pair of source/drain contacts 154 on the silicon channel layer 156 for the silicon transistor 150 and a second pair of source drain/contacts 124 on the semiconductor oxide layer 106 for the oxide transistor 100 with both the first and second pairs of source/drain contacts 154, 124 including a hydrogen trap layer that is characterized by a negative entropy of solution of hydrogen. Routing layer 122 may similarly include a hydrogen trap layer. Such a hydrogen trap layer may be formed of a same material (e.g. Ti) as the gate hydrogen trap layer 114.

In an embodiment, the bottom gate layer 130 has a wider gate width than the second top gate layer 110 for the double gate oxide transistor 100. The semiconductor oxide layer 106 may include doped source/drain regions. For example, the source/drain regions may be n-type. For example, the n-type source/drain regions may optionally be doped with H and/or Ar, though embodiments are not so limited. As illustrated in FIGS. 6A-6C, a first portion of the semiconductor oxide layer 106 directly underneath a shadow of the second top gate layer 110 may correspond to an oxide transistor channel, while a second portion of the semiconductor oxide layer 106 that is directly over a shadow of the bottom gate layer 130, and does not include the first portion, is N− doped, while a third portion of the semiconductor oxide layer 160 outside the shadow of the bottom gate layer is N+ doped. In an embodiment, a N− doped to N+ doped interface is characterized by a hydrogen dopant concentration in the third portion.

Although the embodiments have been described in language specific to structural features and/or methodological acts, it is to be understood that the appended claims are not necessarily limited to the specific features or acts described.

The specific features and acts disclosed are instead to be understood as embodiments of the claims useful for illustration.

What is claimed is:

1. A hybrid thin film transistor structure comprising:
a substrate;
an oxide buffer layer over the substrate, the oxide buffer layer spanning a silicon transistor region and an oxide transistor region;
a silicon channel layer over the oxide buffer layer in the silicon transistor region;
a gate dielectric layer over the silicon channel layer in the silicon transistor region
a top gate layer over the gate dielectric layer in the silicon transistor region;
a bottom gate layer over the oxide buffer layer in the oxide transistor region;
a second oxide buffer layer over the bottom gate layer in the oxide transistor region, the second oxide buffer layer spanning the silicon transistor region and an oxide transistor region;
a semiconductor oxide layer over the second oxide buffer layer in the oxide transistor region;
wherein the semiconductor oxide layer comprises n-type source/drain regions, and:
a first portion of the semiconductor oxide layer directly underneath a shadow of the second top gate layer corresponds to an oxide transistor channel;
a second portion of the semiconductor oxide layer that is directly over a shadow of the bottom gate layer, and does not include the first portion, is N− doped; and
a third portion of the semiconductor oxide layer outside the shadow of the bottom gate layer is N+ doped;
a second gate dielectric layer over the semiconductor oxide layer in the oxide transistor region;
a second top gate layer over the second gate dielectric layer in the oxide transistor region;
wherein the second top gate layer includes a multiple layer stack including a metallic gate layer and a gate hydrogen trap layer that is characterized by a negative entropy of solution of hydrogen; and
wherein the bottom gate layer has a wider gate width than the second top gate layer.

2. The hybrid thin film transistor structure of claim 1, further comprising an interlayer dielectric (ILD) layer over the top gate layer, and spanning the silicon transistor region and the oxide transistor region, wherein the bottom gate layer is over the ILD layer in the oxide transistor region.

3. The display panel hybrid thin film transistor structure of claim 1, wherein a N− doped to N+ doped interface is characterized by a hydrogen dopant concentration in the third portion.

4. The hybrid thin film transistor structure of claim 1, wherein the n-type source/drain regions are doped with a dopant selected from the group consisting of H and Ar.

5. The hybrid thin film transistor structure of claim 1, wherein the substrate comprises a hydrogen containing layer.

6. The hybrid thin film transistor structure of claim 5, further comprising a hydrogen containing planarization layer over the second top gate layer, the hydrogen containing planarization layer spanning the silicon transistor region and an oxide transistor region.

7. The hybrid thin film transistor structure of claim 1, further comprising a first pair of source/drain contacts on the silicon channel layer and a second pair of source drain/ contacts on the semiconductor oxide layer, wherein both the first and second pairs of source/drain contacts comprise a hydrogen trap layer that is characterized by a negative entropy of solution of hydrogen.

8. The hybrid thin film transistor structure of claim 7, wherein the hydrogen trap layer is formed of a same material as the gate hydrogen trap layer.

9. The hybrid thin film transistor structure of claim 1, further comprising a first pair of source/drain contacts on the silicon channel layer and a second pair of source drain/ contacts on the semiconductor oxide layer, wherein both the first and second pairs of source/drain contacts comprise a hydrogen trap layer that is characterized by a negative entropy of solution of hydrogen.

10. The hybrid thin film transistor structure of claim 9, wherein the hydrogen trap layer is formed of a same material as the gate hydrogen trap layer.

11. The hybrid thin film transistor structure of claim 1, wherein the metallic gate layer is over the gate hydrogen trap layer.

12. The hybrid thin film transistor structure of claim 11, wherein the gate hydrogen trap layer comprises a hydrogen trapping material selected from the group consisting of Li, Sc, Y, La, Ce, Ti, Zr, Hf, V, Nb, and Ta.

13. The hybrid thin film transistor structure of claim 12, wherein the gate hydrogen trap layer comprises a hydrogen concentration greater than $1E^{21}/cm^3$.

14. A display panel comprising:
a pixel area including an array of subpixels, each subpixel including an oxide transistor that includes:
a bottom gate layer;
an oxide buffer layer on the bottom gate layer;
a semiconductor oxide layer on the oxide buffer layer;
a gate dielectric layer on the semiconductor oxide layer;
a top gate layer on the gate dielectric layer;
wherein the bottom gate layer has a wider gate width than the top gate layer; and
wherein:
a first portion of the semiconductor oxide layer directly underneath a shadow of the top gate layer corresponds to an oxide transistor channel;
a second portion of the semiconductor oxide layer that is directly over a shadow of the bottom gate layer, and does not include the first portion, is N− doped; and
a third portion of the semiconductor oxide layer outside the shadow of the bottom gate layer is N+ doped.

15. The display panel of claim 14, wherein a N− doped to N+ doped interface is characterized by a hydrogen dopant concentration in the third portion.

16. The display panel of claim 14, wherein a gate width of the top gate layer is smallest for subpixels nearest a center of the pixel area, and the gate width of the top gate layer is widest for subpixels nearest a periphery of the pixel area.

17. The display panel of claim 14, wherein the bottom gate layer includes a bottom multiple layer stack.

18. The display panel of claim 17, wherein the bottom multiple layer stack includes a bottom metallic gate layer and a bottom gate hydrogen trap layer that is characterized by a negative entropy of solution of hydrogen.

19. The display panel of claim 14, wherein the top gate layer includes a multiple layer stack.

20. The display panel of claim 19, wherein the multiple layer stack includes a metallic gate layer and a gate hydrogen trap layer that is characterized by a negative entropy of solution of hydrogen.

21. The display panel of claim 20, wherein the hydrogen trap layer comprises a hydrogen trapping material selected from the group consisting of Li, Sc, Y, La, Ce, Ti, Zr, Hf, V, Nb, and Ta.

* * * * *